United States Patent [19]
Wallace

[11] 3,983,418
[45] Sept. 28, 1976

[54] DRIVE CIRCUIT FOR POWER SWITCHING DEVICE

[75] Inventor: Kenneth A. Wallace, Franklin, Ohio

[73] Assignee: North Electric Company, Galion, Ohio

[22] Filed: May 29, 1975

[21] Appl. No.: 581,914

[52] U.S. Cl............... 307/270; 307/254; 307/314; 307/300
[51] Int. Cl.² ........................................ H03K 17/00
[58] Field of Search .......... 307/253, 254, 270, 300, 307/314

[56] References Cited
UNITED STATES PATENTS

| | | | |
|---|---|---|---|
| 3,131,327 | 4/1964 | Quinn | 307/314 |
| 3,757,144 | 9/1973 | Hetterscheid et al. | 307/300 |
| 3,805,094 | 4/1974 | Orlando | 307/300 |

*Primary Examiner*—Stanley D. Miller, Jr.
*Assistant Examiner*—B. P. Davis
*Attorney, Agent, or Firm*—Charles M. Hutchins

[57] ABSTRACT

A transformer-coupled transistor base drive circuit is disclosed wherein the transformer primary control circuit includes a switching transistor, a bias supply, and a RC biasing network arrangement. The biasing arrangement is designed to ensure that the transformer core will never enter the positive saturation region of its hysteresis characteristic; regardless of variations in the power transistor duty cycle. The base drive circuit also features provision of high sweep-out current in the power transistor base during turn-off, reverse base-emitter voltage during the power transistor off state, and regenerative current drive to minimize storage time and to control the bias power drain.

4 Claims, 4 Drawing Figures

DRIVE CIRCUIT FOR POWER SWITCHING DEVICE

BACKGROUND OF THE INVENTION

1. Field of the Invention

This invention relates to drive circuits for providing turn-on and turn-off control of switching devices such as power transistors normally carrying relatively high values of output current in the on condition. Such drive circuitry is commonly employed as a portion of DC-AC or DC-DC converters.

2. Description of the Prior Art

Transformer-coupled base drive circuits are well known in the art and generally feature regenerative current drive for power transistor turn-on wherein the output current of the power transistor is transformer-coupled back to the base circuit of the power transistor.

In a pending application by Burens et al, also assigned to North Electric Company, Ser. No. 476,254, filed June 4, 1974, now U.S. Pat. No. 3,930,170, a base-drive circuit is disclosed wherein a reverse sweep-out current is provided to the power switching device at turn-off by means of a resistor-capacitor biasing arrangement. However, there is a core reset problem with this and many other prior art arrangements under certain transient conditions which force the transformer core into eventual positive saturation in such a manner as to cause catastrophic failure in the power switching device being controlled by the transformer-coupled base-drive arrangement.

One prior art approach to the core reset problem is found in the Higgins U.S. Pat. No. 3,610,963. This arrangement provides a core reset action prohibiting positive saturation of the transformer core. However, the Higgins approach provides a short circuit rather than a reverse voltage to the base of the power switching device at the initiation of turn-off resulting in much longer turn-off times and inefficient power losses. Provision of a short circuit, as in the Higgins patent, is ineffective in reducing leakage current in the turned-off power device. Also, in the absence of a reverse bias voltage, the power device is more susceptible to false triggering by noise.

SUMMARY OF THE INVENTION

OBJECTS

It is therefore an object of this invention to provide a transformer-coupled drive circuit for a power switching device with an improved transformer biasing arrangement for overcoming the problems of positive core saturation, slow device turn-off speed, and device off-state leakage and noise susceptibility.

Another object of this invention is to provide efficient power switching device control in a reliably simple and low-cost manner.

SUMMARY DESCRIPTION

A control transistor and a biasing network are transformer-coupled to the base drive circuit of a power switching transistor. The transformer secondary comprises two windings mutually poled and connected so as to permit regenerative current feedback from the output current of the power switching transistor to its base current.

To initiate turn-off of the power switching transistor, the control transistor is turned on to effectively place the biasing network across the transformer primary. The biasing network includes a capacitor charged such that a reverse voltage is reflected across the transformer to provide a reverse sweep-out current for hastening the turn-off of the power switching transistor. The biasing network also functions to provide a continuous current for the duration of the conduction time of the control transistor sufficient to reset the transformer core to the negative saturation region. Additionally, the biasing network, via a residual charge on the capacitor, provides a reverse base-emitter voltage for the duration of the off period, thus ensuring a low leakage current through the power switching device and a stable off state.

Turn-on of the power switching transistor is initiated by turn-off of the control transistor thereby interrupting bias current flow through the transformer primary. The resultant collapsing field induces a voltage in the transformer secondary winding in the power transistor base circuit sufficient to initiate conduction through the collector-emitter of the power transistor. Once such conduction begins, sustaining base drive is furnished by the transformer coupling between power transistor emitter and base circuits.

BRIEF DESCRIPTION OF THE DRAWINGS

These and other objects and features of the invention will become apparent from a reading of a description of a preferred embodiment taken in conjunction with the drawing in which FIG. 1 sets out the base drive circuit schematic suitable for use in accordance with the principles of the invention.

DETAILED DESCRIPTION

Figure 1:
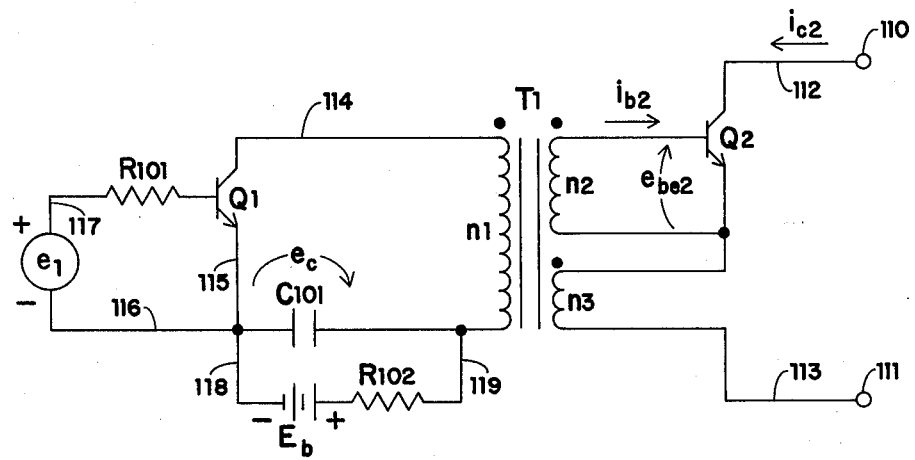

As shown in FIG. 1, power switching transistor Q2 has a collector terminal connected via lead 112 to terminal 110. The emitter of Q2 is connected via winding $n3$ of transformer T1 to lead 113 which is further connected to terminal 111. Terminals 110 and 111 are normally connected to a load circuit including a DC source, suitable for receiving the output collector to emitter current of Q2. The base of Q2 is connected to the emitter of Q2 via winding $n2$ of transformer T1. As seen from the well-known dot convention in FIG. 1, windings $n2$ and $n3$ are poled such that current in $n3$ regeneratively aids current flow in $n2$. The dot end of T1 primary winding $n1$ is connected via lead 114 to the collector of control transistor Q1. The other end of winding $n1$ is connected to the junction point of one terminal of capacitor C101 and one terminal of resistor R102.

The other terminal of resistor R102 is connected to a positive terminal of bias voltage source $E_b$. A negative terminal of $E_b$ is connected via lead 118 to the junction point comprising the other terminal of capacitor C101, lead 115 connected to the emitter of control transistor Q1, and lead 116 connected to the negative terminal of control signal source $e_1$. The positive terminal of $e_1$ is connected via lead 117 to resistor R101, thence to the base lead of control transistor Q1. A detailed example of the method of operation for the circuit of FIG. 1 is now set out hereinbelow. Such a description is best understood when taken in conjunction with FIG. 1, FIG. 2, FIG. 3, and FIG. 4.

Figure 2:
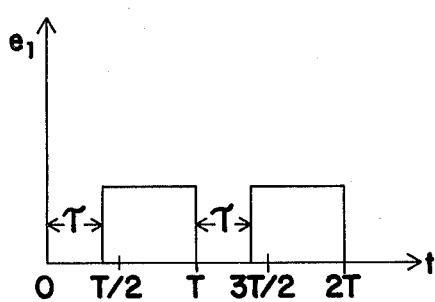
FIG. 2 depicts a voltage waveform suitable for use in switching the control transistor of FIG. 1.

An input signal $e_1$, having a substantially rectangular time waveform as shown in FIG. 2, provides base drive current to control transistor Q1. When Q1 is on, or in a saturated conduction state, current flows from the positive terminal of bias source $E_b$, through resistor R102, through primary winding $n1$, from collector to emitter of transistor Q1, and back to the negative terminal of $E_b$. This current is of sufficient magnitude and polarity to reset the flux in the core of T1 to a point in the negative saturation region 301, such as a point S1, of the hysteresis loop for T1 shown in FIG. 3. The voltage induced in secondary winding $n2$ is negative at the dot, thus reverse biasing the base-emitter junction of power switching transistor Q2 and thereby forcing Q2 to remain in a non-conducting state.

Consider the start of the switching cycle to be at time $t = 0$ in FIG. 2 where $e_1$ goes low. At this point, Q1 is turned off, and the inductive energy stored in primary winding $n1$ of transformer T1 causes the collector voltage of Q1 to go positive. Hence the voltage at the dot end of secondary winding $n2$ also goes positive, and when this voltage exceeds the required base-emitter threshold of transistor Q2, current is reflected from winding $n1$ to winding $n2$ in such a direction as to initiate base drive into Q2. Once Q2 emitter current begins to flow through feedback winding $n3$, Q2 base drive current is enhanced at a forced gain of slightly less than the turns ratio of the secondary winding $n2$ to secondary winding $n3$.

Circuits as shown in FIG. 1, which have been found satisfactory in operation, utilize transformer windings having turns in winding $n1$ on the order of 5 times the turns in winding $n2$, and $n2$ having 5 to 20 times the number of turns in winding $n3$. Specific numbers of turns for individual windings are functions of desired circuit parameters and therefore vary with different applications.

During the conduction time of Q2, its base-emitter junction tends to clamp the voltage across winding $n2$ and hence also across windings $n1$ and $n3$. Also during Q2 conduction time $\tau$, shown in FIG. 2 and FIG. 4, control transistor Q1 is off, and capacitor C101 is charging according to a simple RC time constant through bias voltage $E_b$ and resistor R102. This capacitive charging is shown at the waveform for $e_c$ of FIG. 4.

The variable time interval, $\tau$, is used to control the conduction time of the power switching transistor Q2. In constant frequency pulse width modulated power supplies, $\tau$ is generally limited to less than one-half cycle of operation, T/2 of FIG. 2, where T is the reciprocal of the inverter frequency of operation used by the power supply.

Turn off of power transistor Q2 is initiated at $t = \tau$ when $e_1$ goes high to turn on control transistor Q1. With Q1 in a high conduction state, the voltage $e_c$ across capacitor C101 now acts as a source in a low impedance loop comprising C101, primary winding $n1$, and the collector-emitter impedance of Q1. This loop causes a large surge of reverse base current to flow from Q2 hence minimizing storage time. The reverse current spike is of the general form shown for the $i_{b2}$ waveform of FIG. 4. After base sweep-out and collector current collapse in Q2, the residual charge on C101 maintains a reverse base-emitter voltage on Q2 to ensure stable off-state conditions and low leakage current.

Figure 4:
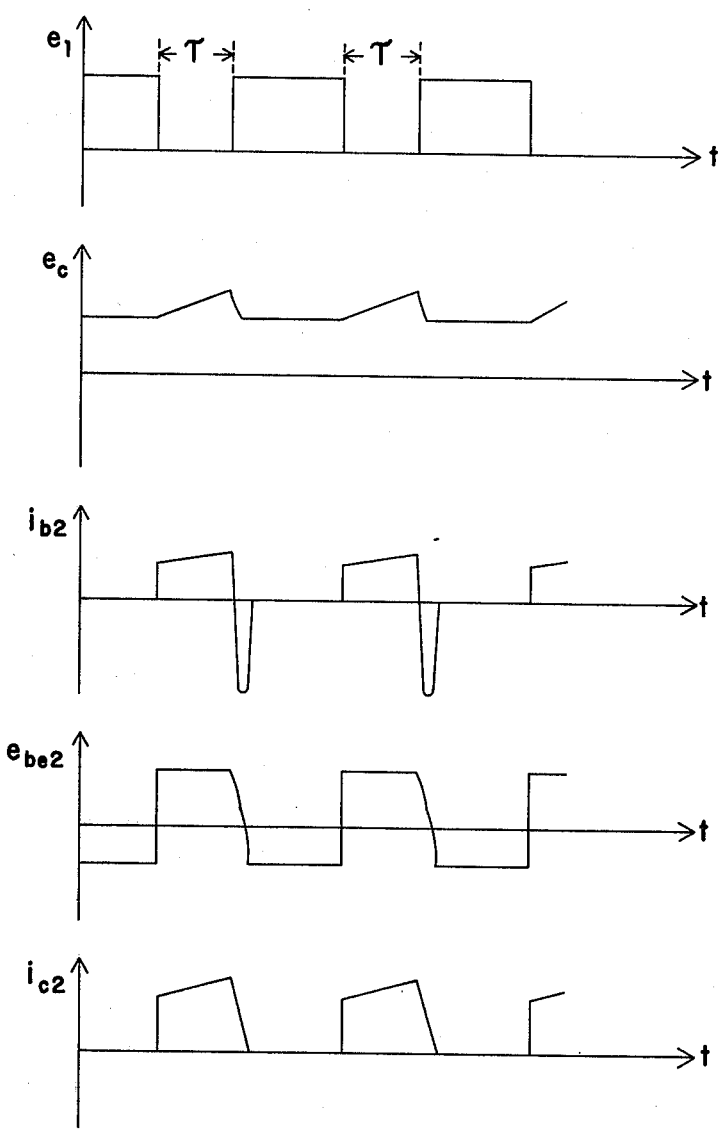
FIG. 4 shows the time relationship of various key signals at pertinent points of the base drive circuit of FIG. 1.

The base-emitter voltage waveform for Q2 is shown in FIG. 4 as $e_{be2}$. The collector current waveform for Q2 is shown in FIG. 4 as $i_{c2}$.

Figure 3:
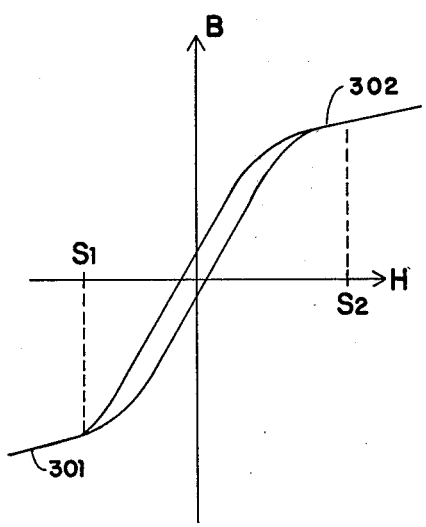
FIG. 3 shows pertinent operating points on the hysteresis characteristic curve for the transformer of the base drive circuit of FIG. 1.

The flux in T1 is reset to a point in the negative saturation region, such as point S1 of FIG. 3, during the time Q2 is off and Q1 is on. The fact that Q1 is on more than it is off, plus the proper selection of R102 and $E_b$, insures that the flux in T1 will never, in the course of several cycles of operation, "walk up" the hysteresis loop to the area of positive saturation, such as point S2 of FIG. 3. Such positive core saturation can lead to catastrophic failure of the power switching transistor Q2. Hence, using the principles of this invention, such a saturation problem is avoided.

A power transistor such as Q2 has been chosen as the power switching device for the sake of example only. The drive circuit of the instant invention may be adapted to other power switching devices, as will be readily apparent to those skilled in the art.

Other embodiments embracing the principles of this invention will be apparent to those skilled in the art. The embodiment set forth hereinabove is used for the sake of example only. The scope and spirit of the invention is to be limited only by the appended claims.

What is claimed is:

1. In a drive circuit for a power switching device, said device having a control electrode and first and second output electrodes, means for controlling the conduction state of said device comprising;

transformer means including a primary winding, a first transformer secondary winding connected between said control electrode and said first output electrode, a second transformer secondary winding connected between said first output electrode and a path for carrying current flowing between said first and second electrodes, said first and second windings mutually poled to provide regenerative coupling therebetween, control switch means having a first switching state and a second switching state, and biasing means connected in series with said control switch means across said primary winding of said transformer means, said control switch means operative, in said first switching state, to enable said biasing means to initiate, via said transformer means, turn-off of said power switching device, to provide a reverse bias to said control electrode, and to reset the transformer core flux operating point, and said control switch means further operative, in said second switching state, to render, via said transformer means, said power switching device conductive by substantially isolating said biasing means from said primary winding.

2. A drive circuit as set forth in claim 1, wherein said biasing means comprises;

capacitance means connected across a serial combination of a resistance means and an electrical energy source, said energy source operative to furnish an electrical charging current to said capacitance means during said second switching state of said control switch means, said capacitance means operative to provide a current through said primary winding for a predetermined time interval during said first switching state of said control switch means, said current of a polarity and magnitude sufficient to initiate, via said transformer means, reverse current in said control electrode, thereby providing said initiation of turn-off of said power switching device, said capacitance means further operative at the end of said predetermined time interval, to provide said reverse bias to said control electrode for the remainder of said first switching state, and said energy source further operative to provide a reset current through said primary winding for said remainder of said first switching state, thereby providing said reset of said transformer core flux operating point.

3. A transformer-coupled drive circuit as set forth in claim 1, wherein said power switching device comprises a transistor, said control electrode comprises a base electrode of said transistor, and said first and second output electrodes comprise respectively an emitter electrode and a collector electrode of said transistor.

4. A transformer-coupled drive circuit as set forth in claim 1, wherein said control switch means includes a switching transistor having a base electrode suitably connected to state control means for selectively determining high and low conduction states between an emitter electrode and a collector electrode of said switching transistor, said high and low conduction states corresponding to said first and said second switching states, respectively.

* * * * *